(12) United States Patent
Hsu et al.

(10) Patent No.: US 8,492,780 B2
(45) Date of Patent: Jul. 23, 2013

(54) LIGHT-EMITTING DEVICE AND MANUFACTURING METHOD THEREOF

(75) Inventors: Chen Ke Hsu, Hsinchu (TW); Win Jim Su, Hsinchu (TW); Chia-Ming Chuang, Hsinchu (TW); Chen Ou, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 519 days.

(21) Appl. No.: 12/703,964

(22) Filed: Feb. 11, 2010

(65) Prior Publication Data

US 2010/0200885 A1 Aug. 12, 2010

(30) Foreign Application Priority Data

Feb. 11, 2009 (TW) ................................ 98104423 A

(51) Int. Cl.
*H01L 33/00* (2010.01)

(52) U.S. Cl.
USPC .......................................................... 257/98

(58) Field of Classification Search
USPC .......................................................... 257/98
See application file for complete search history.

(56) References Cited

U.S. PATENT DOCUMENTS

| 5,779,924 | A  * | 7/1998  | Krames et al. .................. 216/24 |
| 6,531,405 | B1 * | 3/2003  | Wegleiter et al. .............. 438/745 |
| 6,784,462 | B2 * | 8/2004  | Schubert ........................ 257/98 |
| 7,183,136 | B2   | 2/2007  | Hashimura et al. |
| 7,442,965 | B2 * | 10/2008 | Wierer et al. ................... 257/98 |
| 7,446,344 | B2 * | 11/2008 | Fehrer et al. .................... 257/95 |
| 7,521,727 | B2 * | 4/2009  | Khanarian et al. .............. 257/98 |
| 7,579,205 | B2 * | 8/2009  | Ikeda et al. ..................... 438/46 |
| 7,745,240 | B2   | 6/2010  | Furuya |
| 7,829,881 | B2 * | 11/2010 | Yoon ............................... 257/13 |
| 2004/0142503 | A1 * | 7/2004 | Lee et al. ....................... 438/47 |
| 2006/0118802 | A1 * | 6/2006 | Lee et al. ....................... 257/98 |
| 2006/0118803 | A1 * | 6/2006 | Lee et al. ....................... 257/98 |
| 2007/0085100 | A1 * | 4/2007 | Diana et al. .................... 257/98 |

(Continued)

FOREIGN PATENT DOCUMENTS

| CN | 1484328 A | 3/2004 |
| CN | 101106103 A | 1/2008 |

(Continued)

OTHER PUBLICATIONS

Jing Wang et al, "Fabrication of Patterned Sapphire Substrate by Wet Chemical Etching for Maskless Lateral Overgrowth of GaN", Beijing National Laboratory for Condensed Matter Phuysics, Institute of Phesics, Chiesee Academy of Sciesnces, Journal of the Electrochemical Society: 153(3) 2006, pp. C182-C185.

*Primary Examiner* — Jae Lee
*Assistant Examiner* — Grant Withers
(74) *Attorney, Agent, or Firm* — Muncy, Geissler, Olds & Lowe, PLLC

(57) ABSTRACT

A light emitting device and a method of fabricating thereof are provided. The method of fabricating the light emitting device comprises: providing a substrate having a first major surface and a second major surface; forming a plurality of light-emitting stacks on the first major surface; forming an etching protection layer on each of the light emitting stacks; forming a plurality of holes by a discontinuous laser beam on the substrate; etching the plurality of holes; and slicing off the substrate along the plurality of holes to form a light emitting device. The light emitting device has a substrate wherein the sidewall of the substrate comprising a first area with a substantially flat surface and a second area with substantially textured surface.

7 Claims, 7 Drawing Sheets

U.S. PATENT DOCUMENTS

| | | | |
|---|---|---|---|
| 2007/0108459 A1* | 5/2007 | Lu | 257/98 |
| 2007/0267646 A1* | 11/2007 | Wierer et al. | 257/98 |
| 2008/0128722 A1* | 6/2008 | Yuan et al. | 257/98 |
| 2008/0135864 A1* | 6/2008 | David et al. | 257/98 |
| 2008/0303042 A1 | 12/2008 | Minato et al. | |
| 2008/0315236 A1* | 12/2008 | Lu et al. | 257/98 |
| 2009/0045427 A1* | 2/2009 | Wierer et al. | 257/98 |
| 2009/0057700 A1* | 3/2009 | Jin et al. | 257/98 |
| 2009/0242897 A1* | 10/2009 | Bergmann et al. | 257/76 |
| 2009/0267092 A1* | 10/2009 | Fukshima et al. | 257/98 |
| 2009/0283787 A1* | 11/2009 | Donofrio et al. | 257/98 |
| 2011/0266551 A1* | 11/2011 | Thompson et al. | 257/76 |

FOREIGN PATENT DOCUMENTS

| | | |
|---|---|---|
| TW | 200805718 | 5/1996 |
| TW | I270223 | 1/2007 |
| TW | I309481 | 2/2008 |

* cited by examiner

LIGHT-EMITTING DEVICE AND MANUFACTURING METHOD THEREOF

RELATED APPLICATION

This application claims the priority to and the benefit of TW application Ser. No. 098104423 filed on Feb. 11, 2009; the contents of which are incorporated herein by reference in their entirety.

BACKGROUND

1. Technical Field

The present disclosure disclosed a light emitting device which is especially related to the sidewall of the substrate of the light emitting device. The sidewall includes at least a first area and a second area, wherein the morphology of the first area is substantially flat and the morphology of the second area is substantially textured. In addition, the disclosure also disclosed a method of fabricating the light emitting device.

2. Description of the Related Art

The light radiation theory of light emitting diode (LED) is when electrons are moving between an n-type semiconductor and a p-type semiconductor, electron energy difference caused by different band energy between the n and p type semiconductors is released and accompanied by generation of photons. Because the light radiation theory of LED is different from the incandescent light which is through the heating of filament, the LED is also called a "cold" light source. Moreover, the LED is also more sustainable, longevous, light and handy, and less power-consumption, therefore it is considered a new generation product in the lighting markets. The LED applies to various applications like the traffic signal, backlight module, street light and medical instruments, and is gradually replacing the traditional lighting sources.

FIG. 1 illustrates the structure of a conventional light emitting device 100, which includes a transparent substrate 10, a semiconductor stack layer 12 formed above the transparent substrate 10, and an electrode 14 formed above the semiconductor stack layer 12, wherein the semiconductor stack layer 12 comprises, from top, a first conductive-type semiconductor layer 120, an active layer 122, and a second conductive-type semiconductor layer 124.

In addition, the light emitting device 100 can be further connected to other components in order to form a light emitting apparatus. FIG. 2 illustrates a conventional light emitting apparatus including a sub-mount 20 carrying at least an electrical circuit 202, at least a solder 22 formed above the sub-mount 20; wherein the light emitting device 100 is bonded to the sub-mount 20 and is electrically connected with the electrical circuit 202 on the sub-mount 20 by the solder 22, and an electric connection structure 24 that electrically connects the electrode 14 of the light emitting device 100 to the electrical circuit 202 on the sub-mount 20. The sub-mount 20 may be a lead frame or a large size mounting substrate in order to facilitate circuit design and enhance heat dissipation.

Nevertheless, because the surface of the transparent substrate 10 of the conventional light emitting device 100 as shown in FIG. 1 is substantially flat and the refractive index of the transparent substrate 10 is different from the refractive index of the external environment, the total internal reflection (TIR) occurs when a light A emitted from the active layer 122. Therefore the light extraction efficiency from the light emitting device 100 is reduced drastically.

SUMMARY OF THE DISCLOSURE

The present disclosure provides a light emitting device which includes at least a substrate with at least a sidewall comprising a substantially flat first area and a substantially textured second area, and a light emitting stack layer formed on the substrate.

The present disclosure also provides a light emitting device which includes a substrate with at least a sidewall comprising a discontinuous structure made by a first area and a second area, and a light emitting stack layer. The morphology of the first area is substantially flat and the morphology of the second area is substantially textured. The light extraction efficiency of the light emitting device may be enhanced by the discontinuous structure on the sidewall.

The present disclosure further describes a method of fabricating a light emitting device wherein the method includes providing a substrate with a first major surface and a second major surface, forming a semiconductor epitaxial layer on the first major surface, forming an etching protection layer on the semiconductor epitaxial layer, producing a plurality of discontinuous holes on the substrate by a discontinuous laser beam, etching the plurality of discontinuous holes, and cleaving through the plurality of discontinuous holes in order to make the light emitting device.

BRIEF DESCRIPTION OF DRAWINGS

The accompanying drawings are included to provide easy understanding of the application, and are incorporated herein and constitute as part of this specification. The drawings illustrate embodiments of the application and, together with the description, serve to illustrate the principles of the application.

DETAILED DESCRIPTION

The present disclosure describes a light emitting device and a method of fabricating the light emitting device. In order to have a thorough understanding of the present disclosure, please refer to the following description and the illustrations FIG. 3A to FIG. 6.

Figure 1:
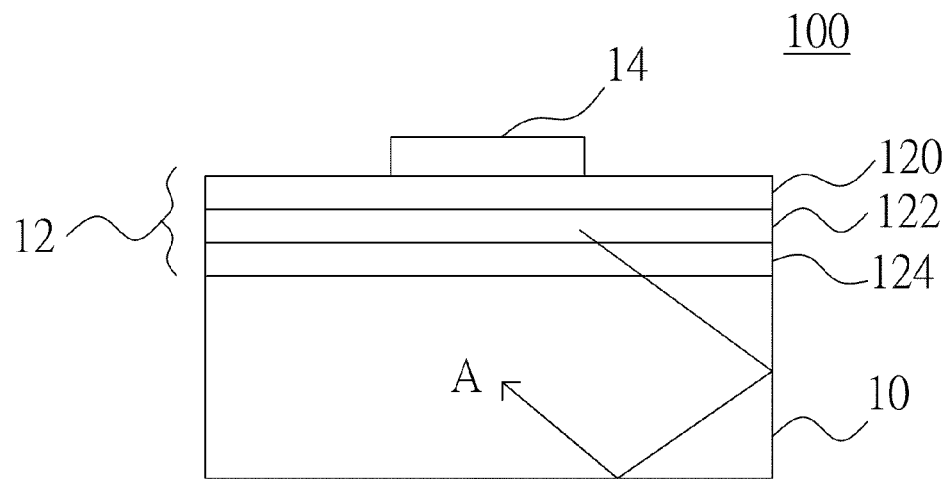
FIG. 1 illustrates the structure of a conventional light emitting device.
Figure 2:
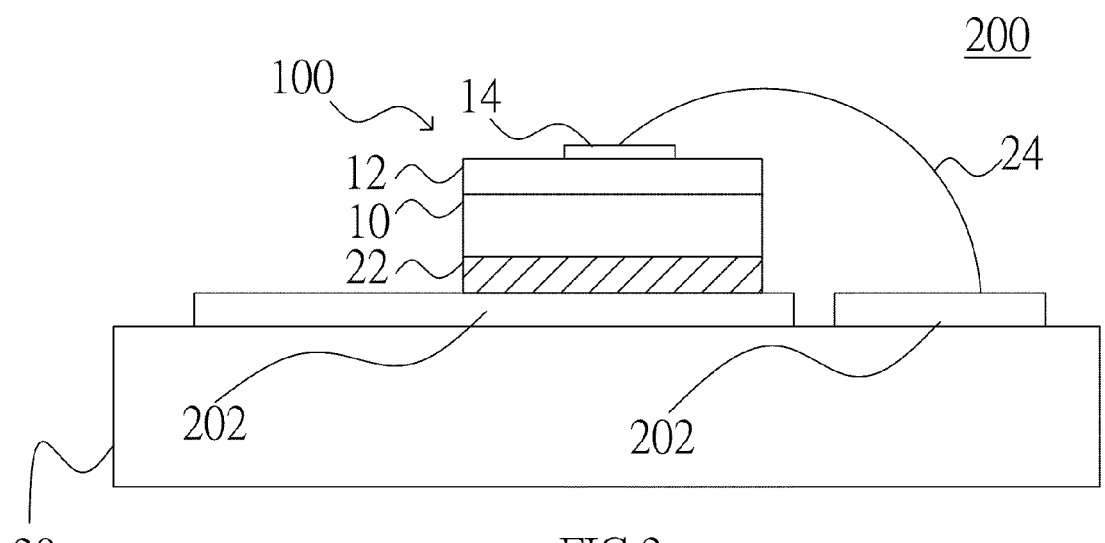
FIG. 2 illustrates the structure of a conventional light emitting apparatus.
Figure 3A:
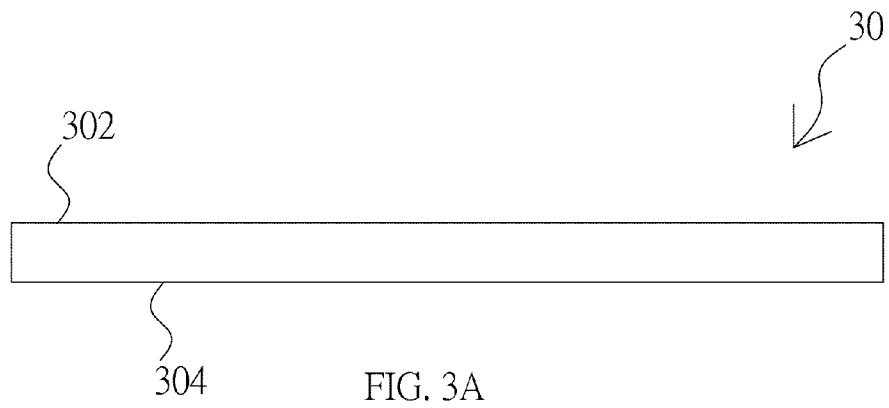
FIGS. 3A to 3I illustrate a process flow of a method of fabricating a light emitting device in the present disclosure.
Figure 3B:
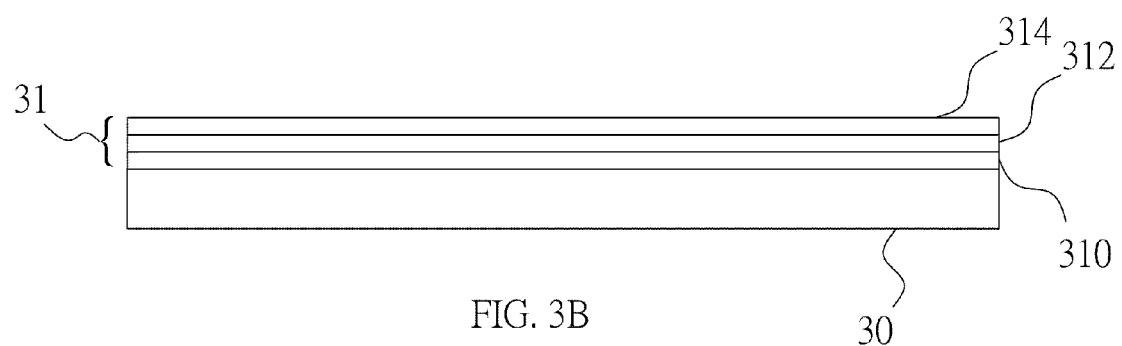

FIGS. 3A to 3I illustrate a process flow of the method of fabricating. FIG. 3A shows a substrate 30 including a first major surface 302 and a second major surface 304. FIG. 3B shows a plurality of a semiconductor epitaxial layer 31 formed on the first major surface 302 of the substrate 30, wherein the semiconductor epitaxial layer 31 includes, from top, at least a first conductive-type semiconductor layer 310, an active layer 312 and a second conductive-type semiconductor layer 314.

Figure 3C:
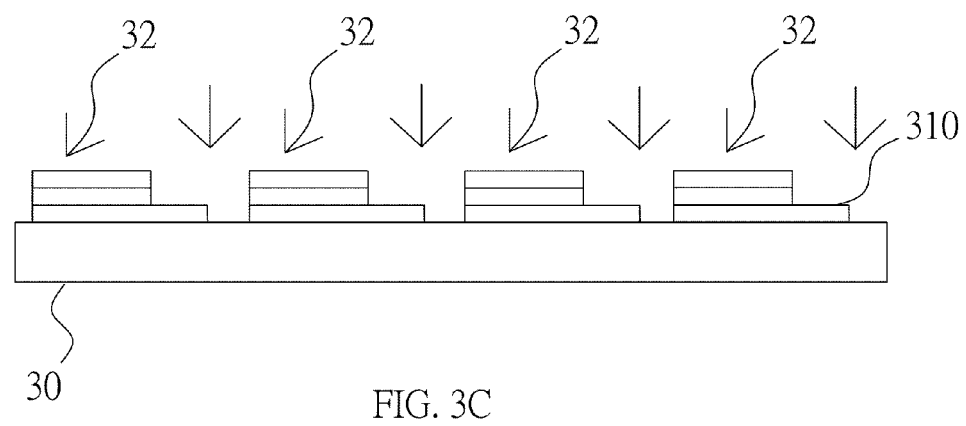
Figure 3D:
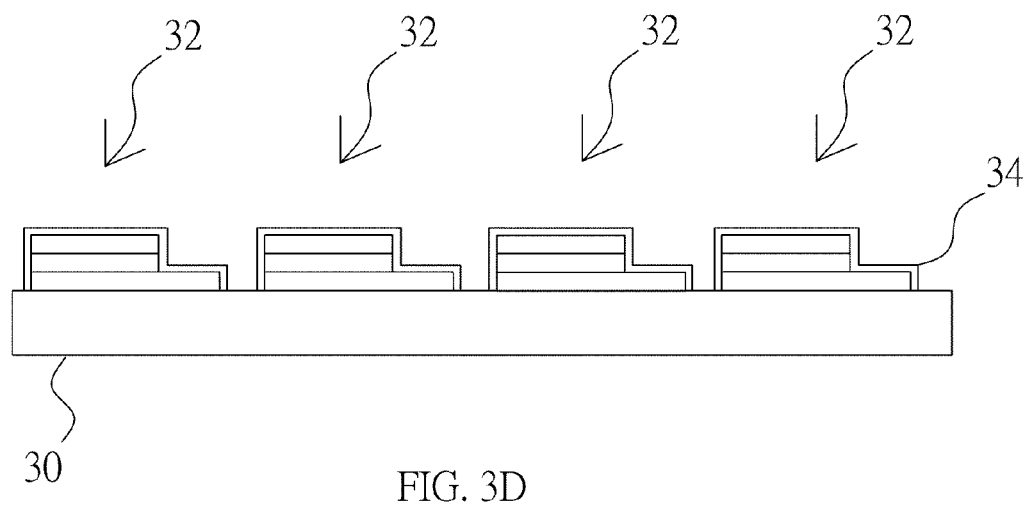
Figure 3E:
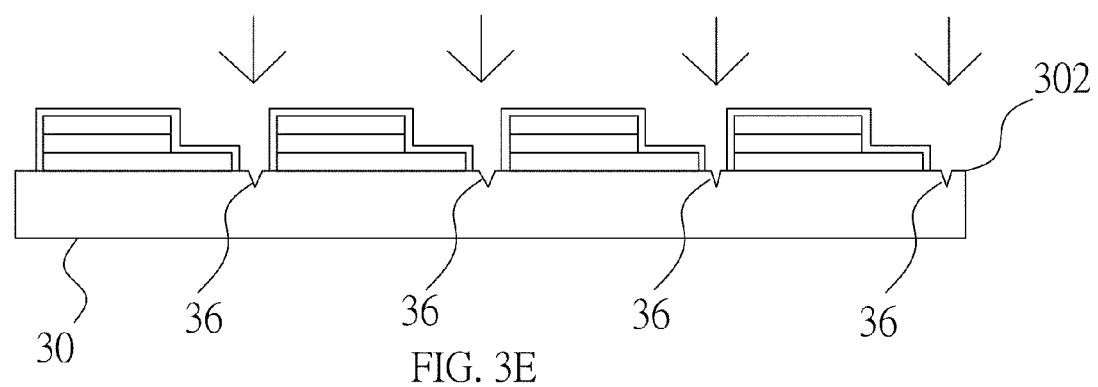
Figure 3F:
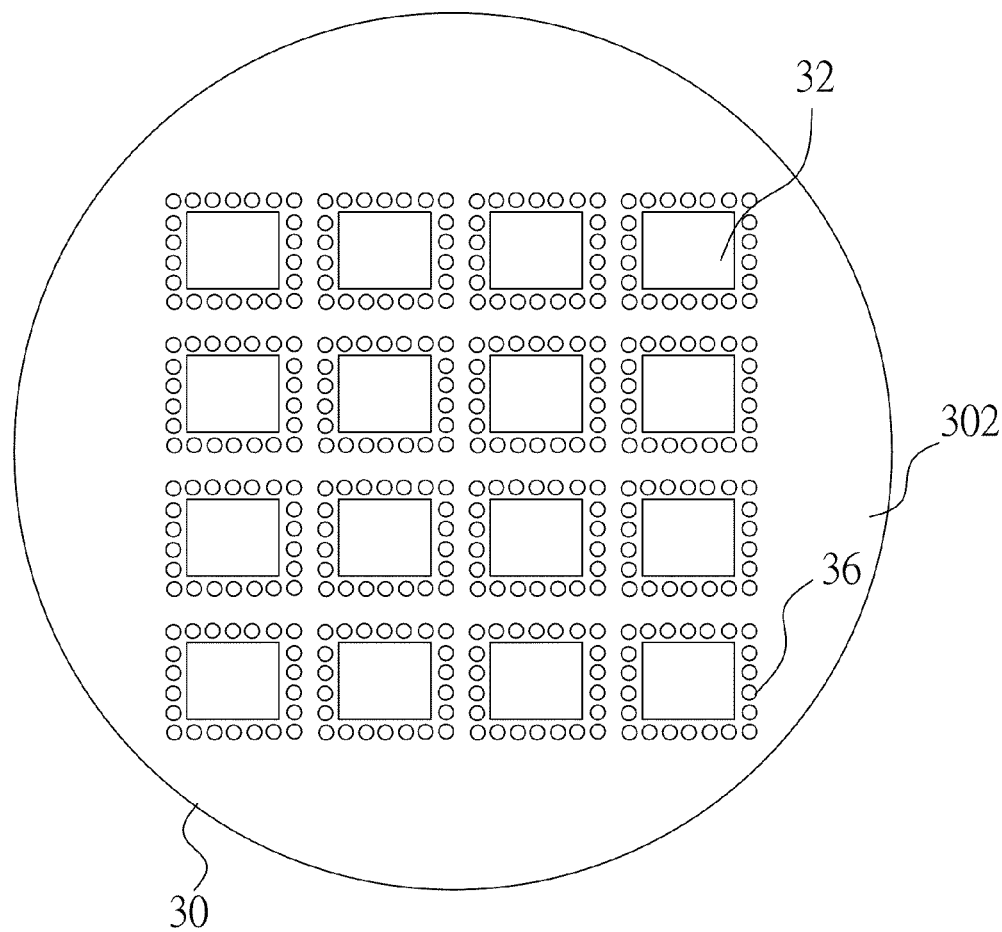

FIG. 3C illustrates a further step by employing photolithography and etching process to etch the semiconductor epitaxial layer 31 in order to expose a portion of the substrate 30 and form a plurality of light emitting stack layers 32 in mesa structure; wherein a portion of the first conductive-type semiconductor layer 310 of each light emitting stack layer 32 is exposed. FIG. 3D shows forming an etching protection layer 34 on the top of the light emitting stack layer 32, wherein the etching protection layer 34 may be formed simultaneously on the top of the light emitting stack layer 32 and the substrate 30 in other embodiments. The material of the etching protection layer 34 may include $SiO_2$ or $SiN_X$. FIG. 3E shows a step by using a discontinuous laser beam to form a plurality of discontinuous holes on the first major surface 302 of the substrate 30, in which the laser moves and emits beam on the substrate 30 with a regular or an irregular pulse. Therefore, a plurality of discontinuous holes 36 is formed on the first major surface 302 of the substrate 30. In the embodiment, the discontinuous laser beam may be a pulsed output, such as a pulsed laser beam. FIG. 3F is a top view of FIG. 3E, and viewing from FIG. 3E and FIG. 3F, the plurality of light emitting stack layer 32 is surrounded by the discontinuous holes 36 formed by the discontinuous laser beam.

Figure 3G:
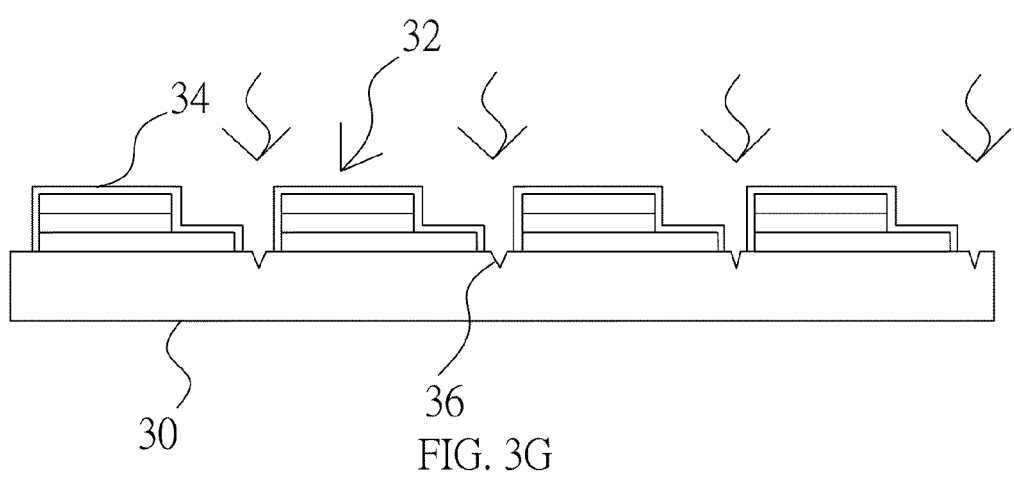
Figure 3H:
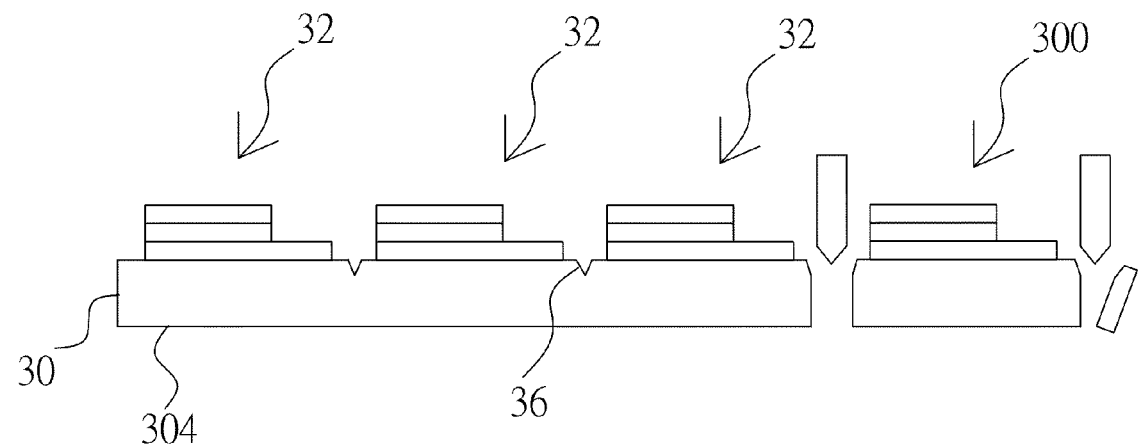

As FIG. 3G indicates that the discontinuous holes 36 are etched by an etching solution in a temperature ranging from 100 to 300 degree Celsius (° C.) for about 10 to 50 minutes. In the embodiment, a better operation condition is having a temperature between 150 to 250 ° C. and an etching duration for about 20 to 40 minutes by an etching solution made of $H_2SO_4$ and $H_3PO_4$, in which the concentration ratio is about 3:1. In another embodiment, the etching solution may be phosphoric acid only. In FIG. 3H, the etching protection layer 34 is removed, and a grind process is performed on the second major surface of the substrate 30 in order to reduce the thickness of substrate 30. Thereafter, a plurality of light emitting devices 300 is fabricated by cleaving the substrate 30 through the plurality of discontinuous holes 36.

Figure 3I:
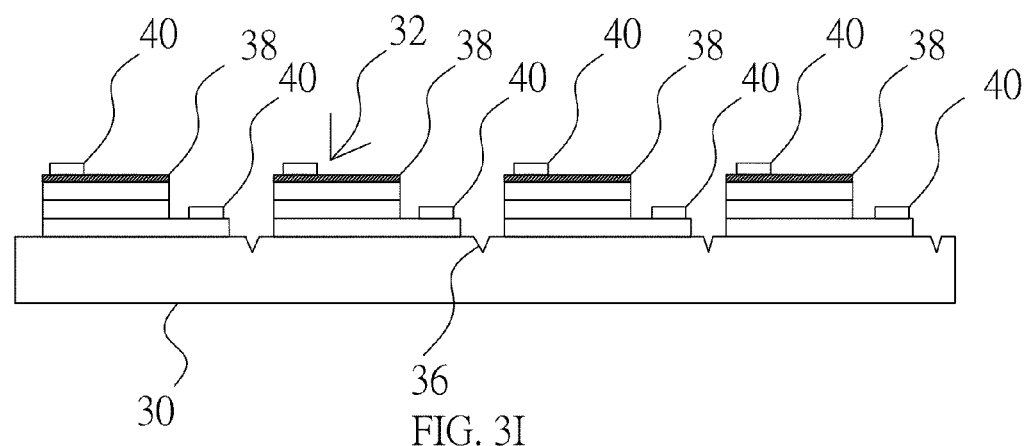

A further embodiment in the present disclosure, as shown in FIG. 3I, comprises a transparent conductive oxide (TCO) layer 38 formed on the light emitting stack layer 32 and an electrode 40 formed on the TCO layer 38.

The embodiments described above disclosing the cleaving made through the discontinuous holes 36 on the first major surface 302 of the substrate 30 by the discontinuous laser beam are only examples and not limited to these embodiments; it will also be appreciated by those having ordinary skill in the art that references to the cleaving can be made through other locations by a discontinuous laser beam, such as the second major surface of the substrate 30 and forming a plurality of discontinuous holes on the second major surface.

Figure 4:
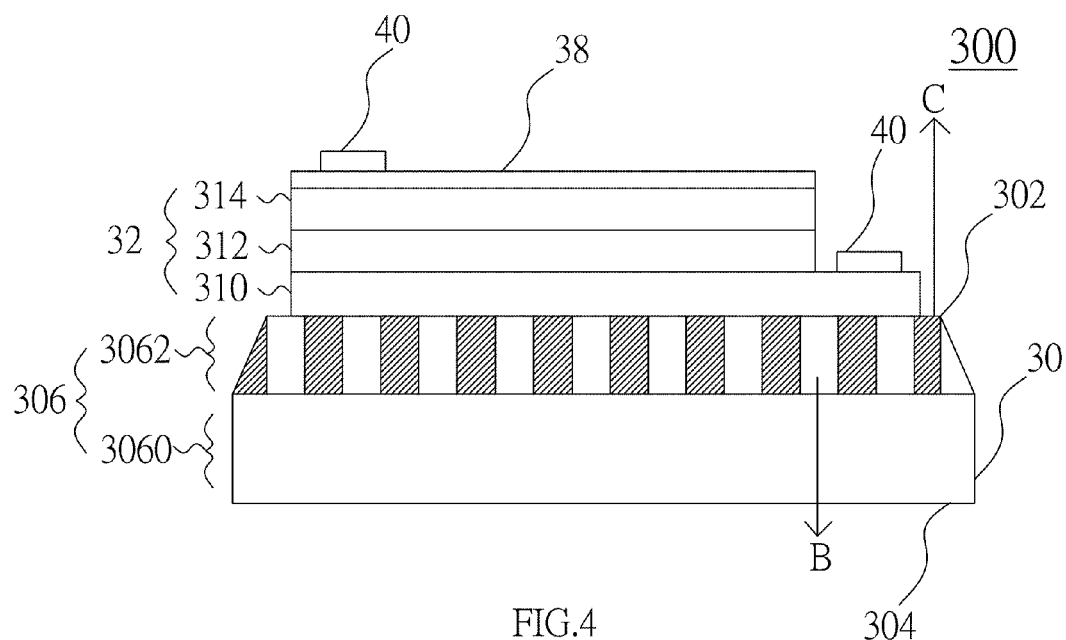
FIG. 4 illustrates the structure of an embodiment in the present disclosure.
Figure 5:
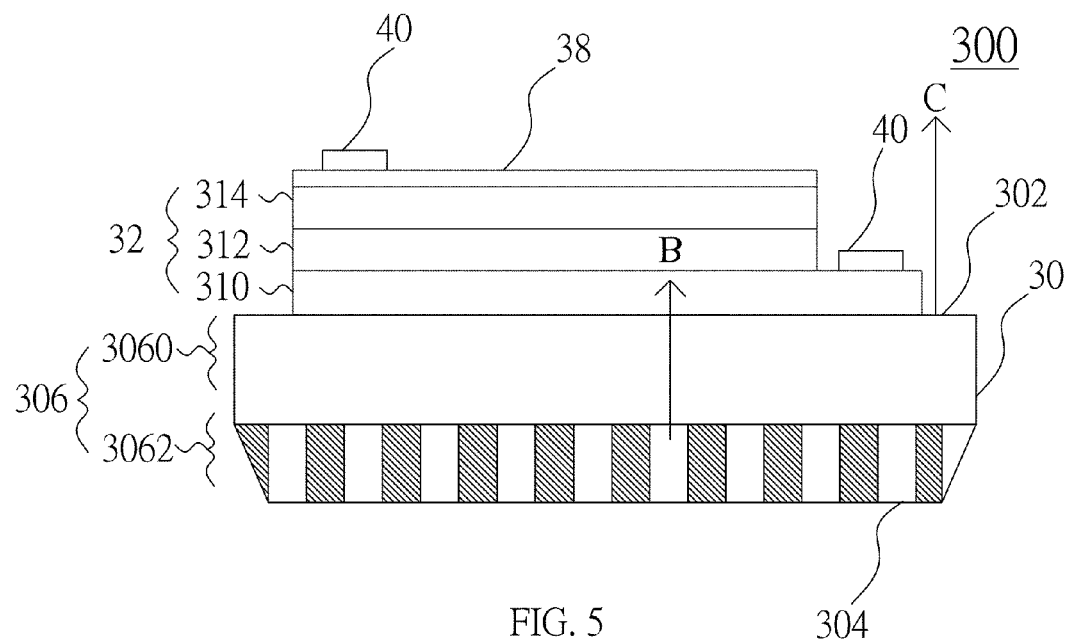
FIG. 5 illustrates the structure of another embodiment in the present disclosure.
Figure 6:
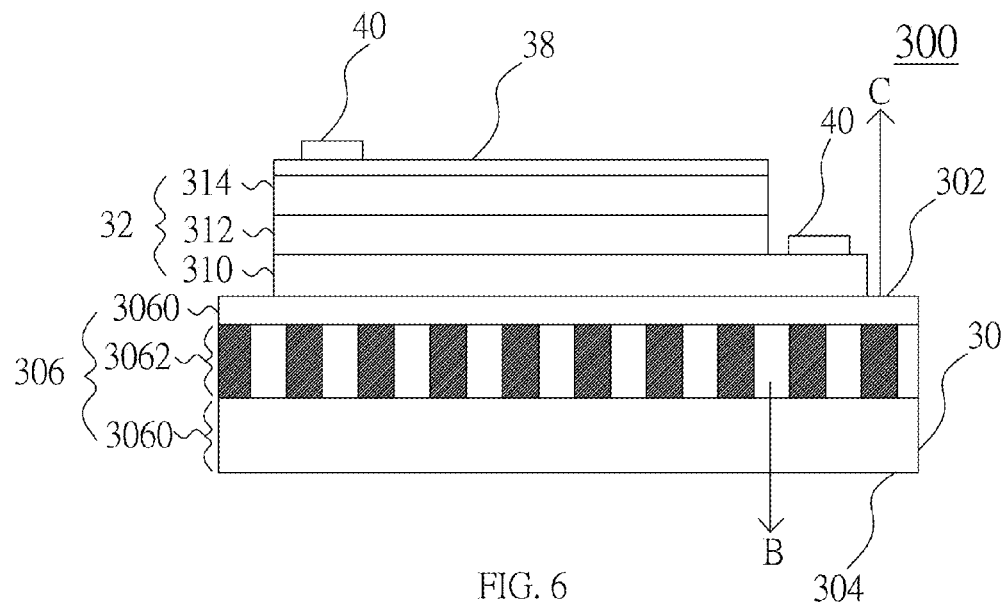
FIG. 6 illustrates the structure of a further embodiment in the present disclosure.

FIG. 4 to FIG. 6 illustrates the structure of embodiments in the present disclosure. As shown in FIG. 4, the light emitting device 300 includes at least a substrate 30 and a light emitting stack layer 32 on the substrate. The substrate 30 includes at least a first major surface 302, a second major surface 304 and at least a sidewall 306. The sidewall 306 of the substrate 30 includes at least a substantially flat first area 3060 and a substantially textured second area 3062, wherein the thickness of the substantially textured second area is about 5 μm to 20 μm. For the embodiment of the present disclosure, the substantially textured second area 3062 is on the sidewall 306 of the substrate 30 and close to the first major surface 302; wherein the convex-concave structure is formed by the textures made by the discontinuous laser beam and an etching process as shown in FIG. 3G. An extension direction B of the convex-concave structure is longitudinal, wherein the extension direction B may be a direction originating from the first major surface 302 of the substrate 30 and moving away from the first major surface 302, or a direction originating from the second major surface 304 of the substrate 30 and moving away from the second major surface 304. The extension direction B may also be a direction originating from the first major surface 302 of the substrate 30 and moving toward the second major surface 304. The extension direction B forms an angle θ with the normal line C of the first major surface 302, herein $0°\leq θ<90°$. For the embodiments of the present disclosure, the extension direction B of the convex-concave structure is substantially parallel to the normal line C of the first major surface 302, i.e. θ is 0°.

The material of the substrate 30 may be a transparent material like sapphire, ZnO or any other suitable materials. Embodiments of the present disclosure use the sapphire. The light emitting stack layer 32 includes, from the top, a first conductive semiconductor layer 310, an active layer 312 and a second conductive semiconductor layer 314. The material of the light emitting stack layer 32 contains at least one element selected from the group consisting of Al, Ga, In, As, P, and N, such as GaN. AlGaInP or any other suitable materials. Embodiments in the present disclosure use GaN.

In addition, the light emitting device 300 includes at least a transparent conductive oxide layer 38 formed on the light emitting stack layer 32 and at least an electrode 40 formed on the transparent conductive oxide layer 38; wherein the material of the transparent conductive oxide layer 38 comprises one or more materials selected from a group consisting of ITO, InO, SnO, CTO, ATO, AZO and ZnO.

FIG. 5 illustrates the structure of another embodiment in the present disclosure. Besides the location of the substantially textured second area 3062 is close to the sidewall 306 of the second major surface 304, components of the light emitting device, composition and connections are the same as the embodiment illustrated in FIG. 4.

FIG. 6 illustrates the structure of a further embodiment in the present disclosure. The substantially textured second area 3062 is located at the middle of the sidewall 306 of the substrate 30 and sandwiched by two substantially flat first areas 3060. The components in the light emitting device, composition and connection are the same as the embodiment illustrated in FIG. 4.

Figure 7:
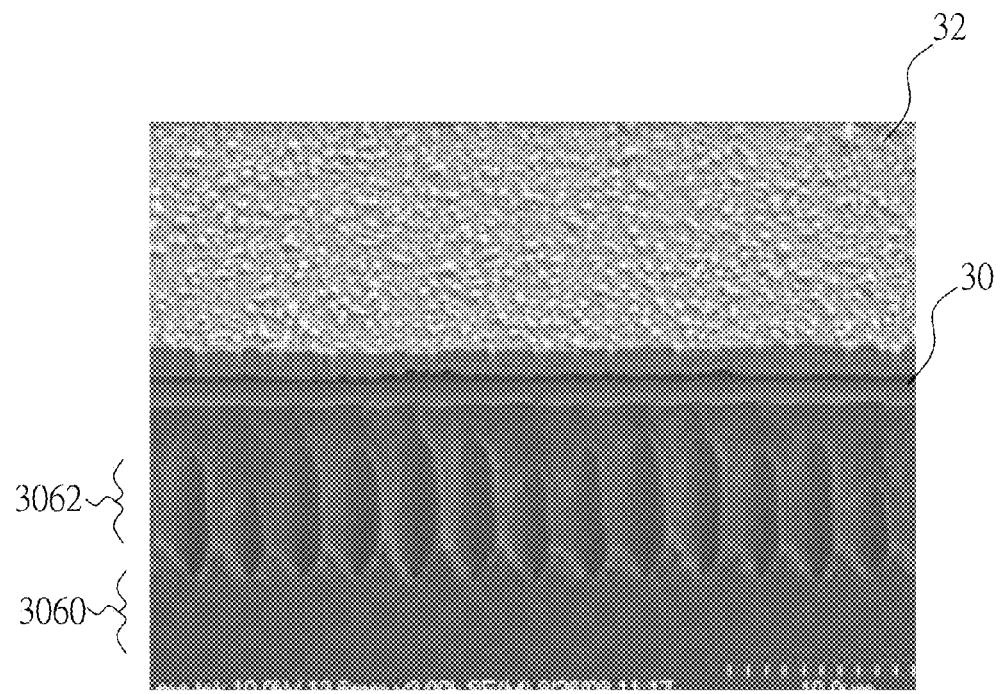
FIG. 7 illustrates a second electron microscope (SEM) picture of an embodiment in the present disclosure.

FIG. 7 illustrates a Scanning Electron Microscope (SEM) picture of an embodiment in the present disclosure. As the picture shows, the second area 3062 of the substrate 30 is a substantially textured surface.

The foregoing description has been directed to the specific embodiments of this application. It will be apparent, however, that other variations and modifications may be made to the embodiments without escaping the spirit and scope of the application.

The invention claimed is:

1. A light emitting device comprising:
   a substrate, wherein the substrate comprises a first major surface, a second major surface, and a sidewall; and
   a light emitting stack layer formed on the first major surface of the substrate, comprising a first conductive-type semiconductor layer, an active layer and a second conductive-type semiconductor layer;
   wherein the sidewall of the substrate comprises a first area and a second area;
   wherein the morphology of the first area is substantially flat and the morphology of the second area is substantially textured.

2. The light emitting device of claim 1, wherein the second area is a convex-concave structure.

3. The light emitting device of claim 2, wherein an extension direction of the convex-concave structure is longitudinal.

4. The light emitting device of claim 2, wherein the extension direction of the convex-concave structure comprises a direction originating from the first major surface and extending toward the second major surface, a direction originating from the first major surface and extending away from the first major surface, and/or a direction originating from the second major surface and extending away from the second major surface.

5. The light emitting device of claim 2, wherein the extension direction of the convex-concave structure is substantially parallel to the normal line of the first major surface or that of the second major surface of the substrate.

6. The light emitting device of claim 1, wherein the first area is formed on the sidewall of the substrate and located close to the first major surface or the second major surface.

7. The light emitting device of claim 1, wherein the second area is formed on the sidewall of the substrate; wherein the second area is sandwiched by two of the first areas.

* * * * *